US009224554B2

(12) United States Patent
Krumpelman

(10) Patent No.: US 9,224,554 B2
(45) Date of Patent: Dec. 29, 2015

(54) ANTI-TILT AND ROTATION TECHNIQUES FOR A TOUCHSURFACE ASSEMBLY HAVING TRANSLATING KEYS

(71) Applicant: SYNAPTICS INCORPORATED, San Jose, CA (US)

(72) Inventor: Doug Krumpelman, Hayden, ID (US)

(73) Assignee: Synaptics Incorporated, San Jose, CA (US)

( * ) Notice: Subject to any disclaimer, the term of this patent is extended or adjusted under 35 U.S.C. 154(b) by 226 days.

(21) Appl. No.: 14/038,175

(22) Filed: Sep. 26, 2013

(65) Prior Publication Data

US 2014/0262717 A1 Sep. 18, 2014

Related U.S. Application Data

(60) Provisional application No. 61/783,316, filed on Mar. 14, 2013.

(51) Int. Cl.
*H01H 13/76* (2006.01)
*H01H 13/85* (2006.01)
(Continued)

(52) U.S. Cl.
CPC ............... *H01H 13/76* (2013.01); *H01H 13/85* (2013.01); *H01H 13/88* (2013.01); *H03K 17/975* (2013.01); *H01H 2221/026* (2013.01); *H01H 2221/04* (2013.01); *H01H 2239/006* (2013.01)

(58) Field of Classification Search
CPC . H01H 13/85; H01H 13/88; H01H 2239/006; H01H 2221/04; H01H 13/76; H01H 2221/026; H03K 17/975
USPC .......... 200/5 A, 5 R, 344, 510, 250; 400/490–496
See application file for complete search history.

(56) References Cited

U.S. PATENT DOCUMENTS 3,886,341 A 5/1975 Forrest
3,938,642 A 2/1976 Van Rumpt et al.
(Continued)

FOREIGN PATENT DOCUMENTS

DE 19704253 A 8/1998
DE 10126670 A1 12/2002
(Continued)

OTHER PUBLICATIONS

"Elastomers: Powerful Polymer", Retrieved from <http://appliancedesign.com/copyright/>, (Jun. 2006),5 pages.
(Continued)

*Primary Examiner* — Edwin A. Leon
(74) *Attorney, Agent, or Firm* — Osha Liang LLP

(57) ABSTRACT

The key assembly comprises a keycap having a touchsurface for receiving a press force that moves the keycap from an unpressed position toward a pressed position. The keycap has first and second ramp contacting features comprising first and second angular protrusions. The first and second angular protrusions have first and second protrusion angles relative to first and second side portions of the keycap (respectively). The key assembly also has a base having first and second ramps that contact the first and second ramp contacting features and guide the keycap in the press direction and the second direction as the keycap moves from the unpressed position toward the pressed position. The base has first and second angular features configured to contact the first and second angular protrusions of the first and second ramp contacting features (respectively) to resist rotation of the keycap as the keycap moves toward the pressed position.

20 Claims, 7 Drawing Sheets

(51) Int. Cl.
*H01H 13/88* (2006.01)
*H03K 17/975* (2006.01)

(56) References Cited

U.S. PATENT DOCUMENTS

| | | | |
|---|---|---|---|
| 4,039,068 A | 8/1977 | Giorza et al. | |
| 4,056,701 A | 11/1977 | Weber | |
| 4,265,557 A | 5/1981 | Runge | |
| 4,294,555 A | 10/1981 | Galaske et al. | |
| 4,326,195 A | 4/1982 | Seki et al. | |
| 4,334,280 A | 6/1982 | McDonald | |
| 4,403,123 A | 9/1983 | Shek | |
| 4,480,162 A | 10/1984 | Greenwood | |
| D278,239 S | 4/1985 | Felix et al. | |
| D284,574 S | 7/1986 | Fischer | |
| D292,801 S | 11/1987 | Davis et al. | |
| 4,735,520 A | 4/1988 | Suzuki et al. | |
| 4,786,766 A | 11/1988 | Kobayashi | |
| 4,885,565 A | 12/1989 | Embach | |
| D312,623 S | 12/1990 | Carter et al. | |
| 5,053,591 A | 10/1991 | Theurer | |
| 5,121,091 A | 6/1992 | Fujiyama | |
| 5,189,390 A | 2/1993 | Fagard | |
| 5,212,473 A | 5/1993 | Louis | |
| 5,239,152 A | 8/1993 | Caldwell et al. | |
| 5,329,278 A | 7/1994 | Dombroski | |
| 5,418,530 A | 5/1995 | Moore et al. | |
| 5,463,195 A | 10/1995 | Watanabe et al. | |
| 5,523,730 A | 6/1996 | Van Zeeland | |
| 5,575,576 A | 11/1996 | Roysden, Jr. | |
| 5,626,223 A | 5/1997 | Lee | |
| 5,666,096 A | 9/1997 | Van Zeeland | |
| 5,667,061 A * | 9/1997 | Lee | 200/533 |
| 5,763,842 A | 6/1998 | Tsai et al. | |
| 5,828,015 A | 10/1998 | Coulon | |
| 5,867,082 A | 2/1999 | Van Zeeland | |
| 5,902,972 A | 5/1999 | Nestor et al. | |
| 5,921,382 A * | 7/1999 | Retter | 200/514 |
| 5,934,454 A | 8/1999 | Burleson et al. | |
| 5,973,670 A | 10/1999 | Barber et al. | |
| 5,977,867 A | 11/1999 | Blouin | |
| 5,977,888 A | 11/1999 | Fujita et al. | |
| 5,982,304 A | 11/1999 | Selker et al. | |
| 5,990,772 A | 11/1999 | Van Zeeland et al. | |
| 6,039,258 A | 3/2000 | Durbin et al. | |
| 6,046,730 A | 4/2000 | Bowen et al. | |
| 6,067,081 A | 5/2000 | Hahlganss et al. | |
| 6,069,545 A | 5/2000 | Van Zeeland | |
| 6,069,552 A | 5/2000 | Van Zeeland | |
| 6,118,435 A | 9/2000 | Fujita et al. | |
| 6,130,593 A | 10/2000 | Van Zeeland | |
| 6,166,662 A | 12/2000 | Chuang | |
| 6,218,966 B1 | 4/2001 | Goodwin et al. | |
| 6,219,034 B1 | 4/2001 | Elbing et al. | |
| 6,262,646 B1 | 7/2001 | Van Zeeland | |
| 6,262,717 B1 | 7/2001 | Donohue et al. | |
| 6,305,071 B1 | 10/2001 | Van Zeeland | |
| 6,328,489 B1 | 12/2001 | Chi-Pin | |
| 6,369,692 B1 | 4/2002 | Van Zeeland | |
| 6,369,803 B2 | 4/2002 | Brisebois et al. | |
| 6,373,463 B1 | 4/2002 | Beeks | |
| 6,375,372 B1 | 4/2002 | Tsau | |
| 6,392,515 B1 | 5/2002 | Van Zeeland et al. | |
| 6,400,246 B1 | 6/2002 | Hill et al. | |
| 6,429,846 B2 | 8/2002 | Rosenberg et al. | |
| 6,430,023 B1 | 8/2002 | Suzuki | |
| 6,455,794 B2 | 9/2002 | Sato et al. | |
| 6,466,118 B1 | 10/2002 | Van Zeeland et al. | |
| 6,509,818 B2 | 1/2003 | Van Zeeland | |
| 6,542,058 B2 | 4/2003 | Van Zeeland | |
| 6,556,112 B1 | 4/2003 | Van Zeeland et al. | |
| 6,563,434 B1 | 5/2003 | Olodort et al. | |
| 6,566,616 B1 | 5/2003 | Ha | |
| 6,657,139 B2 | 12/2003 | Hasunuma | |
| 6,677,843 B1 | 1/2004 | Monroe et al. | |
| 6,693,626 B1 | 2/2004 | Rosenberg | |
| 6,723,935 B1 | 4/2004 | Watanabe | |
| 6,723,937 B2 | 4/2004 | Englemann et al. | |
| 6,750,415 B2 | 6/2004 | Yamagami | |
| 6,761,494 B2 | 7/2004 | Hsu et al. | |
| 6,819,990 B2 | 11/2004 | Ichinose | |
| 6,822,635 B2 | 11/2004 | Shahoian et al. | |
| 6,861,603 B1 | 3/2005 | Wang | |
| 6,880,994 B2 | 4/2005 | Takahashi | |
| 6,911,901 B2 | 6/2005 | Bown | |
| 6,937,124 B1 | 8/2005 | Nakamura et al. | |
| 6,939,065 B2 | 9/2005 | Roysden, Jr. | |
| 6,940,030 B2 | 9/2005 | Takeda et al. | |
| 6,982,617 B2 | 1/2006 | Brilon et al. | |
| D527,004 S | 8/2006 | Yen | |
| 7,106,305 B2 | 9/2006 | Rosenberg | |
| 7,113,177 B2 | 9/2006 | Franzen | |
| 7,119,798 B2 | 10/2006 | Yoshikawa et al. | |
| 7,148,789 B2 | 12/2006 | Sadler et al. | |
| 7,166,795 B2 | 1/2007 | Lengeling | |
| 7,182,691 B1 | 2/2007 | Schena | |
| 7,196,688 B2 | 3/2007 | Schena | |
| 7,215,329 B2 | 5/2007 | Yoshikawa et al. | |
| 7,224,106 B2 | 5/2007 | Pei et al. | |
| 7,227,537 B2 | 6/2007 | Nakayama et al. | |
| 7,269,484 B2 | 9/2007 | Hein | |
| 7,292,227 B2 | 11/2007 | Fukumoto et al. | |
| 7,312,791 B2 | 12/2007 | Hoshino et al. | |
| 7,324,094 B2 | 1/2008 | Moilanen et al. | |
| 7,336,266 B2 | 2/2008 | Hayward et al. | |
| 7,339,572 B2 | 3/2008 | Schena | |
| 7,342,573 B2 | 3/2008 | Ryynaenen | |
| 7,375,656 B2 | 5/2008 | Mueller et al. | |
| 7,385,308 B2 | 6/2008 | Yerdon et al. | |
| 7,400,319 B2 | 7/2008 | Nakayama et al. | |
| 7,450,110 B2 | 11/2008 | Shahoian et al. | |
| 7,525,415 B2 | 4/2009 | Yatsu et al. | |
| 7,548,232 B2 | 6/2009 | Shahoian et al. | |
| 7,567,232 B2 | 7/2009 | Rosenberg | |
| 7,569,786 B2 | 8/2009 | Spies | |
| 7,573,460 B2 | 8/2009 | Strawn et al. | |
| 7,579,758 B2 | 8/2009 | Maruyama et al. | |
| 7,589,607 B2 | 9/2009 | Rochon et al. | |
| 7,592,901 B2 | 9/2009 | Furusho | |
| 7,592,999 B2 | 9/2009 | Rosenberg et al. | |
| 7,602,384 B2 | 10/2009 | Rosenberg et al. | |
| 7,607,087 B2 | 10/2009 | Prados | |
| 7,701,440 B2 | 4/2010 | Harley | |
| 7,855,715 B1 | 12/2010 | Bowen | |
| 7,868,515 B2 | 1/2011 | Krochmal et al. | |
| 7,898,440 B2 | 3/2011 | Chen | |
| 7,969,288 B2 | 6/2011 | Braun et al. | |
| 7,982,720 B2 | 7/2011 | Rosenberg et al. | |
| 8,031,181 B2 | 10/2011 | Rosenberg et al. | |
| 8,059,105 B2 | 11/2011 | Rosenberg et al. | |
| 8,094,130 B2 | 1/2012 | Griffin et al. | |
| 8,199,033 B2 | 6/2012 | Peterson et al. | |
| 8,203,531 B2 | 6/2012 | Peterson et al. | |
| 8,217,289 B2 | 7/2012 | Liu | |
| 8,222,799 B2 | 7/2012 | Polyakov et al. | |
| 8,232,969 B2 | 7/2012 | Grant et al. | |
| 8,248,277 B2 | 8/2012 | Peterson et al. | |
| 8,248,278 B2 | 8/2012 | Schlosser et al. | |
| 8,309,870 B2 * | 11/2012 | Peterson et al. | 200/344 |
| 8,310,444 B2 | 11/2012 | Peterson et al. | |
| 8,451,426 B2 | 5/2013 | Iino | |
| 8,629,362 B1 * | 1/2014 | Knighton et al. | 200/344 |
| 2001/0002648 A1 | 6/2001 | Van Zeeland | |
| 2002/0054060 A1 | 5/2002 | Schena | |
| 2002/0084721 A1 | 7/2002 | Walczak | |
| 2002/0149561 A1 | 10/2002 | Fukumoto et al. | |
| 2003/0067449 A1 | 4/2003 | Yoshikawa et al. | |
| 2003/0209131 A1 | 11/2003 | Asahi | |
| 2003/0210233 A1 | 11/2003 | Frulla | |
| 2004/0252104 A1 | 12/2004 | Nakamura et al. | |
| 2005/0017947 A1 | 1/2005 | Shahoian et al. | |
| 2005/0157893 A1 | 7/2005 | Pelrine et al. | |
| 2005/0204906 A1 | 9/2005 | Lengeling | |
| 2005/0237309 A1 | 10/2005 | Sharma | |

(56) References Cited

U.S. PATENT DOCUMENTS

| | | | |
|---|---|---|---|
| 2006/0256075 | A1 | 11/2006 | Anastas et al. |
| 2006/0261983 | A1 | 11/2006 | Griffin et al. |
| 2007/0031097 | A1 | 2/2007 | Heikenfeld et al. |
| 2007/0080951 | A1 | 4/2007 | Maruyama et al. |
| 2007/0091070 | A1 | 4/2007 | Larsen et al. |
| 2007/0146317 | A1 | 6/2007 | Schena |
| 2007/0146334 | A1 | 6/2007 | Inokawa |
| 2007/0152974 | A1 | 7/2007 | Kim et al. |
| 2007/0193436 | A1 | 8/2007 | Chu |
| 2007/0205988 | A1 | 9/2007 | Gloyd et al. |
| 2007/0234887 | A1 | 10/2007 | Sawada et al. |
| 2007/0234890 | A1 | 10/2007 | Yamashita |
| 2007/0236449 | A1 | 10/2007 | Lacroix et al. |
| 2007/0236450 | A1 | 10/2007 | Colgate et al. |
| 2008/0007529 | A1 | 1/2008 | Paun et al. |
| 2008/0083314 | A1 | 4/2008 | Hayashi et al. |
| 2008/0084384 | A1 | 4/2008 | Gregorio et al. |
| 2008/0087476 | A1 | 4/2008 | Prest et al. |
| 2008/0092720 | A1 | 4/2008 | Yamashita et al. |
| 2008/0100568 | A1 | 5/2008 | Koch et al. |
| 2008/0165127 | A1 | 7/2008 | Eom |
| 2008/0289952 | A1 | 11/2008 | Pelrine et al. |
| 2008/0302647 | A1 | 12/2008 | Villain et al. |
| 2008/0303782 | A1 | 12/2008 | Grant et al. |
| 2009/0002205 | A1 | 1/2009 | Klinghult et al. |
| 2009/0072662 | A1 | 3/2009 | Sadler et al. |
| 2009/0073128 | A1 | 3/2009 | Marsden |
| 2009/0079593 | A1 | 3/2009 | Yamakawa et al. |
| 2009/0088220 | A1 | 4/2009 | Persson |
| 2009/0128501 | A1 | 5/2009 | Lazaridis et al. |
| 2009/0178913 | A1 | 7/2009 | Peterson et al. |
| 2009/0189790 | A1 | 7/2009 | Peterson et al. |
| 2009/0189873 | A1 | 7/2009 | Peterson et al. |
| 2009/0210568 | A1 | 8/2009 | Peterson et al. |
| 2009/0231277 | A1 | 9/2009 | Peterson et al. |
| 2009/0255793 | A1 | 10/2009 | Krochmal et al. |
| 2010/0171715 | A1 | 7/2010 | Peterson et al. |
| 2010/0231423 | A1 | 9/2010 | Yang |
| 2010/0245231 | A1 | 9/2010 | Aramaki |
| 2011/0096013 | A1 | 4/2011 | Krumpelman et al. |
| 2011/0128239 | A1 | 6/2011 | Polyakov et al. |
| 2011/0203912 | A1 | 8/2011 | Niu |
| 2011/0227872 | A1 | 9/2011 | Huska et al. |
| 2011/0234494 | A1 | 9/2011 | Peterson et al. |
| 2012/0043191 | A1 | 2/2012 | Kessler et al. |
| 2012/0092263 | A1 | 4/2012 | Peterson et al. |
| 2012/0169603 | A1 | 7/2012 | Peterson et al. |
| 2012/0268384 | A1 | 10/2012 | Peterson et al. |
| 2012/0299832 | A1 | 11/2012 | Peterson et al. |

FOREIGN PATENT DOCUMENTS

| | | | |
|---|---|---|---|
| DE | 202005002417 | A | 4/2005 |
| DE | 102004005501 | A | 8/2005 |
| EP | 0278916 | A | 8/1988 |
| EP | 1548776 | A | 6/2005 |
| EP | 2003666 | A1 | 12/2008 |
| EP | 2287873 | A | 2/2011 |
| JP | 2000348562 | A | 12/2000 |
| JP | 2007173087 | A | 7/2007 |
| JP | 2011233406 | A | 11/2011 |

OTHER PUBLICATIONS

"Haptic Touch Technology", Pacinian,(Nov. 2007),2 pages.
"Haptics: Learning Through Touch", Retrieved from <http://ced.ncsu.edu/nanoscale/haptics.htm>, (2004),5 pages.
"International Search Report and Written Opinion", Application No. PCT/US2010/020380, (Apr. 12, 2010),10 pages.
"Nanoactuators Based on Electrostatic Forces on Dielectrics", Retrieved from <http://www.nasatech.com/Briefs/Apr05/NPO30747.html>on Nov. 28, 2005, NASA's Jet Propulsion Laboratory, Pasadena, CA,4 pages.
New SRI International sSpin-Off, Artificial Muscle, Inc., Secure Series a Funding from Leading VC Firms, Retrieved from <http://www.sri.com/news/releases/05-03-04.html> on Jan. 30, 2008, SRI International Spin Offs Artificial Muscle, Inc,(May 2004),2 pages.
USPTO, "Non-Final Office Action mailed Dec. 9, 2011", U.S. Appl. No. 12/580,002, 21 pages.
"Proposed Experiment Protocol and Details", Retrieved from <http://bdml.stanford.edu/twiki/bin/view/Haptics/ProposedExperiOmentPr- otocolAndDetails>, 5 pages.
"Tactile Perception and Design", Retrieved from http://www.tireesias.org/reports.tpd2.htm on Apr. 4, 2006, 10 pages.
"Touch and Haptics", 2004 IEEE/ RSJ International Conference on Intelligent Robots and Systems, (Sep. 28, 2004),32 pages.
"Touch-Hapsys", Retrieved from <http://www.touch-hapsys.org>, 2 pages.
Ashley, Steven "Artificial Muscles", Scientific American, Available at <www.sciam.com>,(Oct. 2003),pp. 53-59.
Bar-Cohen, Y. "Electroactive Polymer (EAP) Actuators as Artificial Muscles—Reality, Potential and Challenges", SPIE Press, (Mar. 18, 2004),pp. 26 and 548-550.
Bar-Cohen, Yoseph "Electric Flex", IEEE Spectrum Online, (Jun. 2004),6 pages.
Bar-Cohen, Yoseph "Electroactive Polymers as Artificial Muscles—Capabilities, Potentials and Challenges", Robotics 2000, Available at <www.spaceandrobotics>,(Feb. 28-Mar. 2, 2000),pp. 1-8.
Bar-Cohen, Yoseph "Electroactive Polymers", Retrieved from <http://electrochem.cwru.edu/ed/encycl/>, Electrochemistry Encyclopedia,(Dec. 2004),7 pages.
Bar-Cohen, Yoseph "Low Mass Muscle Actuators (LoMMAs)", Telerobotic Task Sponsored by NASA HQ, Code S, (Oct. 23, 1997),18 pages.
Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.
Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.
Bark, Karlin "Functional Prototype I", Retrieved from <http://bdml.stanford.edu/twiki/bin/view/Haptics/FunctionalPrototypeI?-skin=print.pattern>, (Aug. 9, 2005),3 pages.
Beavers, Alex "Basic Concepts for Commercial Applications of Electroactive Polymer Artificial Muscle", Artificial Muscle Incorporated, Menlo Park, CA,10 pages.
Bicchi, Antonio et al., "Haptic Illusions Induced by the Tactile Flow", Interdepartmental Research Centre "E. Piaggo", University of Pisa,12 pages.
Poupyrev, Ivan, et al., "TouchEngine: A Tactile Display for Handheld Devices", 2002, 2 pages.
Bifano, Thomas, "Parallel Plate Electrostatic Actuation for High-Resolution Deformable Mirrors", Boston University, Boston, MA, Aug. 19, 2004.
Biggs, James "Some Useful Information for Tactile Display Design", IEEE Transactions on Man-Machine Systems, vol. 11, No. 1,(1970),pp. 19-24.
Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.
Fontaine, Ebraheem "A Laboratory Demonstration of a Parallel Robotic Mechanism", Massachusetts Institute of Technology,(Jun. 2002),pp. 1-14.
Fukumoto, Masaki, et al, "Active Click: Tactile Feedback for Touch Panels", NTT DoCoMo Multimedia Labs, Mar. 31, 2001, 2 pages.
Gorinevsky, Dimitry "Adaptive membrane for large lightweight space telescopes", SPIE Astronomical Telescopes and Instrumentation,(2002),pp. 1-9.
Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.
Hollis, Ralph "Haptics", Berkshire Encyclopedia of Human-Computer Interaction, Berkshire Publishing Group,(2004), pp. 311-316.

(56) References Cited

OTHER PUBLICATIONS

Jager, Edwin et al., "Microfabricating Conjugated Polymer Actuators", Science Magazine, vol. 290, www.sciencemag.org,(Nov. 24, 2000),pp. 1540-1544.
Jones, Gail et al., "A Comparison of Learning with Haptic and Visual Modalities", National Science Foundation REC-0087389,pp. 1-20.
Jones, Lynette "Human Factors and Haptic Interfaces", Department of Mechanical Engineering, Massachusetts Institute of Technology,40 pages.
Jungmann, M., et al, Miniaturised Electrostatic Tactile Display with High Structural Compliance, 2002, 6 pages.
Kajimoto, Hiroyuki et al., "Electro-Tactile Display with Tactile Primary Color Approach", Graduate School of Information and Technology, The University of Tokyo,2 pages.
MacKenzie, Scott, et al, "The Tactile Touchpad", 1997, 5 pages.
MacKenzie, Scott, et al., "A Comparison of Three Selection Techniques for Touchpads", Proceedings of the CHI'98 Conference on Human Factors in Computing Systems, pp. 336-343 New York 1998.
Mok Ha, Soon et al., "Interpenetrating Polymer Networks for High-Performance Electroelastomer Artificial Muscles", Department of Materials Science and Engineering, UCLA,pp. 1-19.
USPTO, Non-Final Office Action mailed Feb. 13, 2009, U.S. Appl. No. 11/945,879.
Odell, D.L. et al., "MicroRobot Conveyance and Propulsion System Using Comb Drive and Parallel Plate Actuators: the ScuttleBot", UC Berkley,4 pages.
O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.
Oniszczak, Aleks, "VersaPad Driver Plus Pack", 1999, 3 pages.
Pasquero, Jerome "Stimulation of the Fingertip by Lateral Skin Strech", Retrieved from <http://www.cim.mcgill.ca/.about.jay/index.sub.--files/research.htm>- ;, 5 pages.
Pasquero, Jerome "Stress: A Tactile Display Using Lateral Skin Stretch", Department of Electrical and Computer Engineering McGill University, Montreal,(Oct. 2003),75 pages.
Pasquero, Jerome "Survey on Communication Through Touch", Technical Report: TR-CIM 06.04, Center for Intelligent Machines Department of Electrical and Computer Engineering,(Jul. 2006),pp. 1-27.
Pasquero, Jerome "Tactile Display Survey", Technical Report TR-CIM 06.04,6 pages.
Pei, Qibing et al., "Multiple-Degrees-of-Freedom Electroelastomer Roll Actuators", SRI International Institute of Physics Publishing, (2004),pp. N86-N92.
Poupyrev, Ivan, et al., "Tactile Interfaces for Small Touch Screens", 2003, 4 pages.
Raisamo, Roope "Tactile User Interfaces", New Interaction Techniques,(Aug. 2, 2001),30 pages.
Seeger, Joseph et al., "Dynamics and Control of Parallel-Plate Actuators Beyond the Electrostatic Instability", Transducers "99 the 10th International Conference on Solid State Sensors and Actuators, (Jun. 1999),pp. 474-477.
Sommer-Larsen, Peter "Artificial Muscles", Rise National Laboratory, Condensed Matter Physics and Chemistry Department,3 pages.
Spires, Shelby "Artificial Strongman", Smart Business: For the New Economy, (Nov. 2000),1 page.
Srinivasan, Mandayam A., et al, "Role of Skin Biomechanics in Mechanoreceptor Response", Retrieved from <http://touchlab.mit.edu/oldresearch/currentwork/humanhaptics/roleofsk- inbiomechanics/> on Dec. 20, 2007, MIT Touch Lab, (Dec. 20, 2007),pp. 1-13.
USPTO, Supplemental Notice of Allowance mailed May 20, 2010, U.S. Appl. No. 11/945,879.
Wagner, Christopher et al., "Integrating Tactile and Force Feedback with Finite Element Models", Division of Engineering and Applied Sciences, Harvard University,6 pages.
Wagstaff, Jeremy, "A Passion for the Keys", The Wall Street Journal Online, Nov. 23, 2007, 3 pages, retrieved from the Internet at online.wsj.com/article_print/SB119578337324301744.html.
Wing, Alan et al., "Multidimensional Haptics Preliminary Report", Retrieved from <http://www.touch-hapsys.org>, (Sep. 21, 2003),pp. 1-125.
Wingert, Andreas et al., "On the Kinematics of Parallel Mechanisms with Bio-stable Polymer Actuators", Department of Mechanical Engineering, Massachusetts Institute of Technology Cambridge,8 pages.
Wu, Xingtao et al., "A Generalized Capacitance-Based Model for Electrostatic Micro-Actuators", Department of Physics, New Jersey Institute of Technology, Newark, NJ, 07102-1982 Department of Mechanical Engineering, Columbia University, NY 10027, pp. 1-23.
Yang, Gi-Hun, "Novel Haptic Mouse System for Holistic Haptic Display and Potential of Vibrotactile Stimulation", Human-Robot Interaction Research Center, Korea Advanced Institute of Science and Technology, 2005, 17 pages.
Zou, Jun et al., "Design of a Wide Turning Range Micromachined Turnable Capacitor for Wireless Communications", First IEEE Electro/Information Technology Conference, Jun. 8-11, Chicago, IL, 2000, 6 pages.
USPTO, Non-Final Office Action mailed May 14, 2012, U.S. Appl. No. 13/323,292.
USPTO, Final Office Action mailed Aug. 1, 2012 for U.S. Appl. No. 12/580,002.
USPTO, Notice of Allowance mailed Jan. 10, 2014 for U.S. Appl. No. 13/198,610.

* cited by examiner

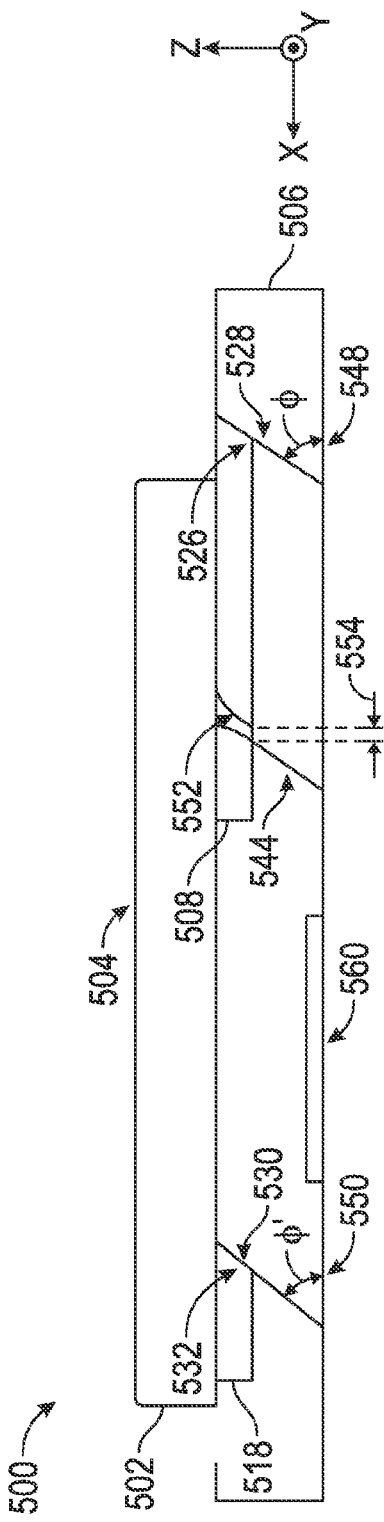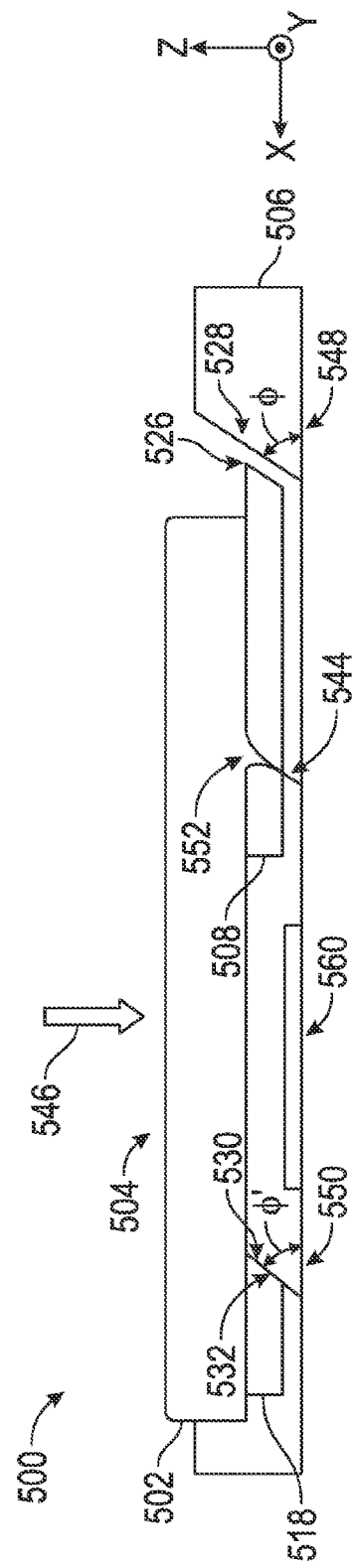

ANTI-TILT AND ROTATION TECHNIQUES FOR A TOUCHSURFACE ASSEMBLY HAVING TRANSLATING KEYS

RELATED APPLICATION(S)

This application claims the benefit of U.S. Provisional Application No. 61/783,316 filed Mar. 14, 2013.

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Methods and apparatus for a touchsurface assembly such as a key assembly are described. The key assembly comprises a keycap having a touchsurface for receiving a press force that moves the keycap from an unpressed position toward a pressed position. The unpressed position and pressed position are separated in a press direction and a second direction orthogonal to the press direction. The keycap has first and second ramp contacting features comprising first and second angular protrusions. The first and second angular protrusions have first and second protrusion angles relative to first and second side portions of the keycap (respectively). The key assembly also comprises a base having first and second ramps that contact the first and second ramp contacting features and guide the keycap in the press direction and the second direction as the keycap moves from the unpressed position toward the pressed position. The base has first and second angular features configured to contact the first and second angular protrusions of the first and second ramp contacting features (respectively) to resist rotation of the keycap as the keycap moves toward the pressed position.

BRIEF DESCRIPTION OF DRAWINGS

Example embodiments of the present invention will hereinafter be described in conjunction with the appended drawings which are not to scale unless otherwise noted, where like designations denote like elements, and:

FIGS. 7A-B show simplified cross-section side views of an example touchsurface assembly according to an embodiment.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
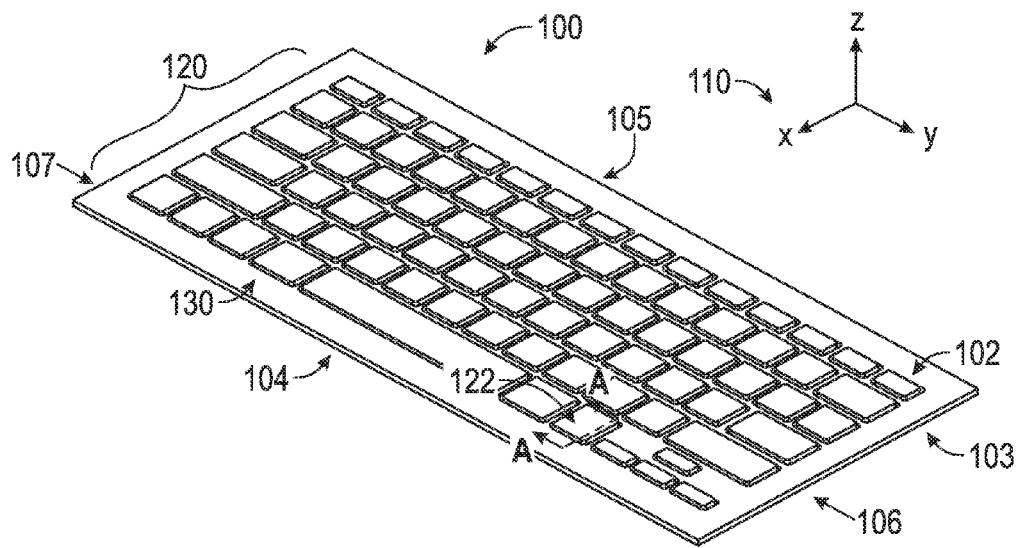
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into or coupled to computer such as a laptop computer comprising one or more processing systems. The processing system(s) each comprise one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
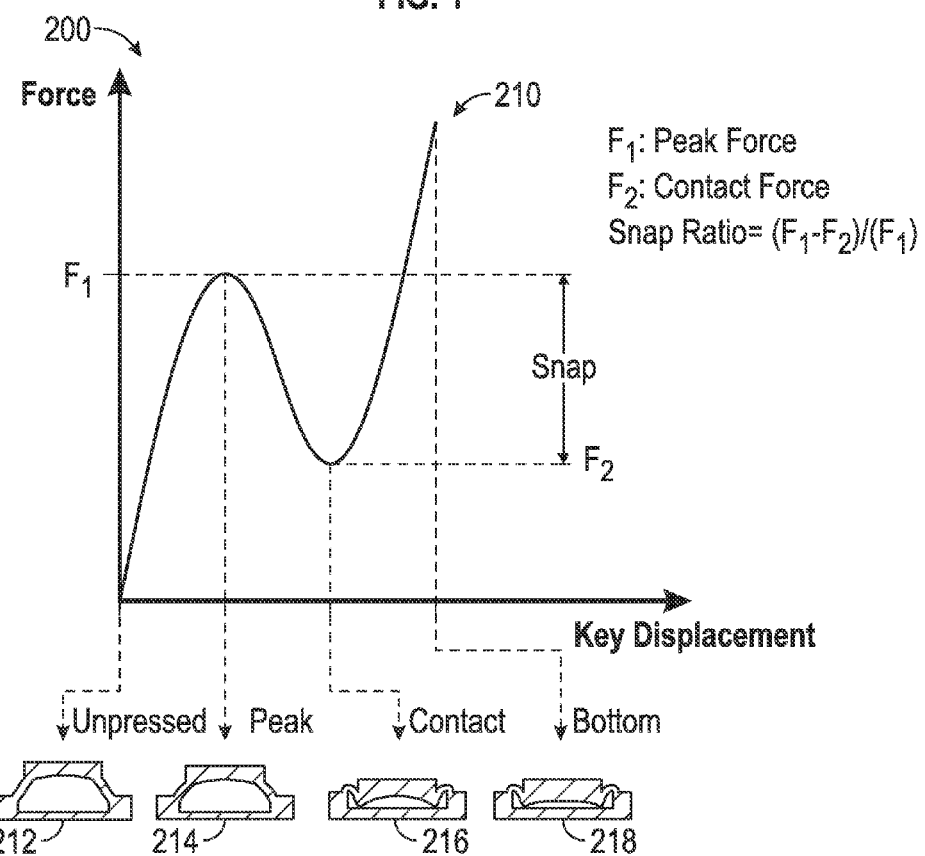
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
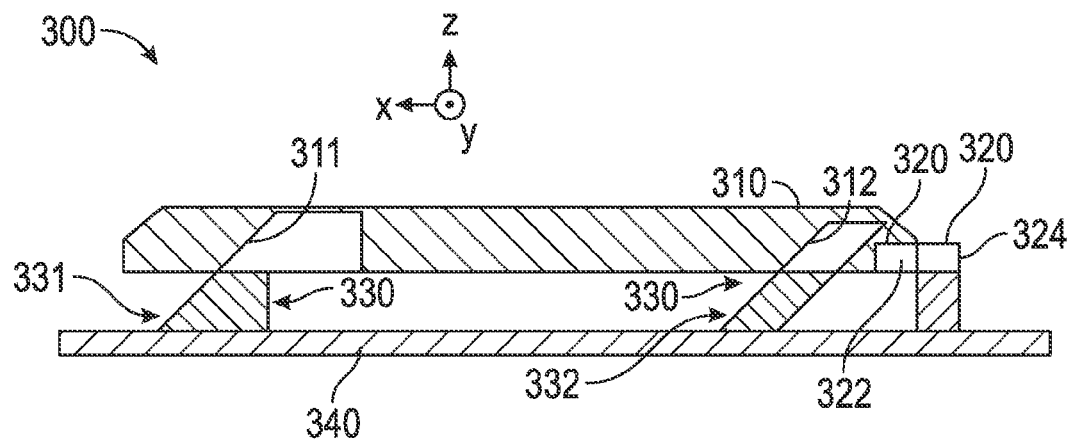
FIGS. 3A-3B are simplified side views of a first example touchsurface assembly configured in accordance with the techniques described herein.
Figure 3B:
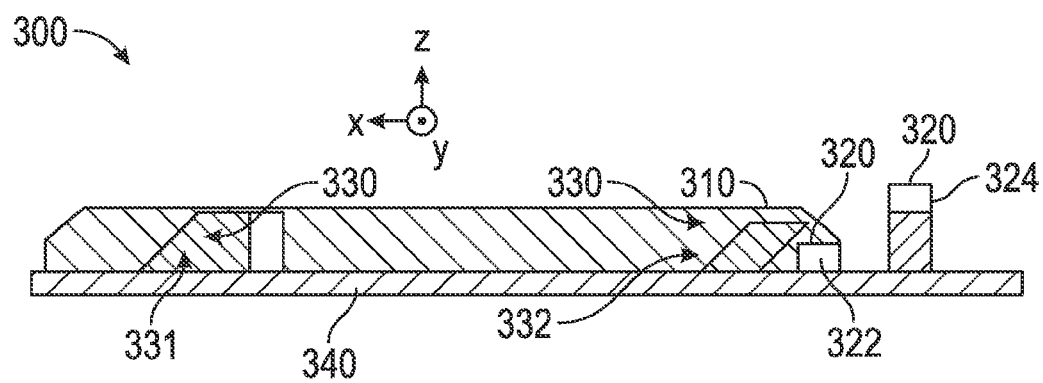

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIGS. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
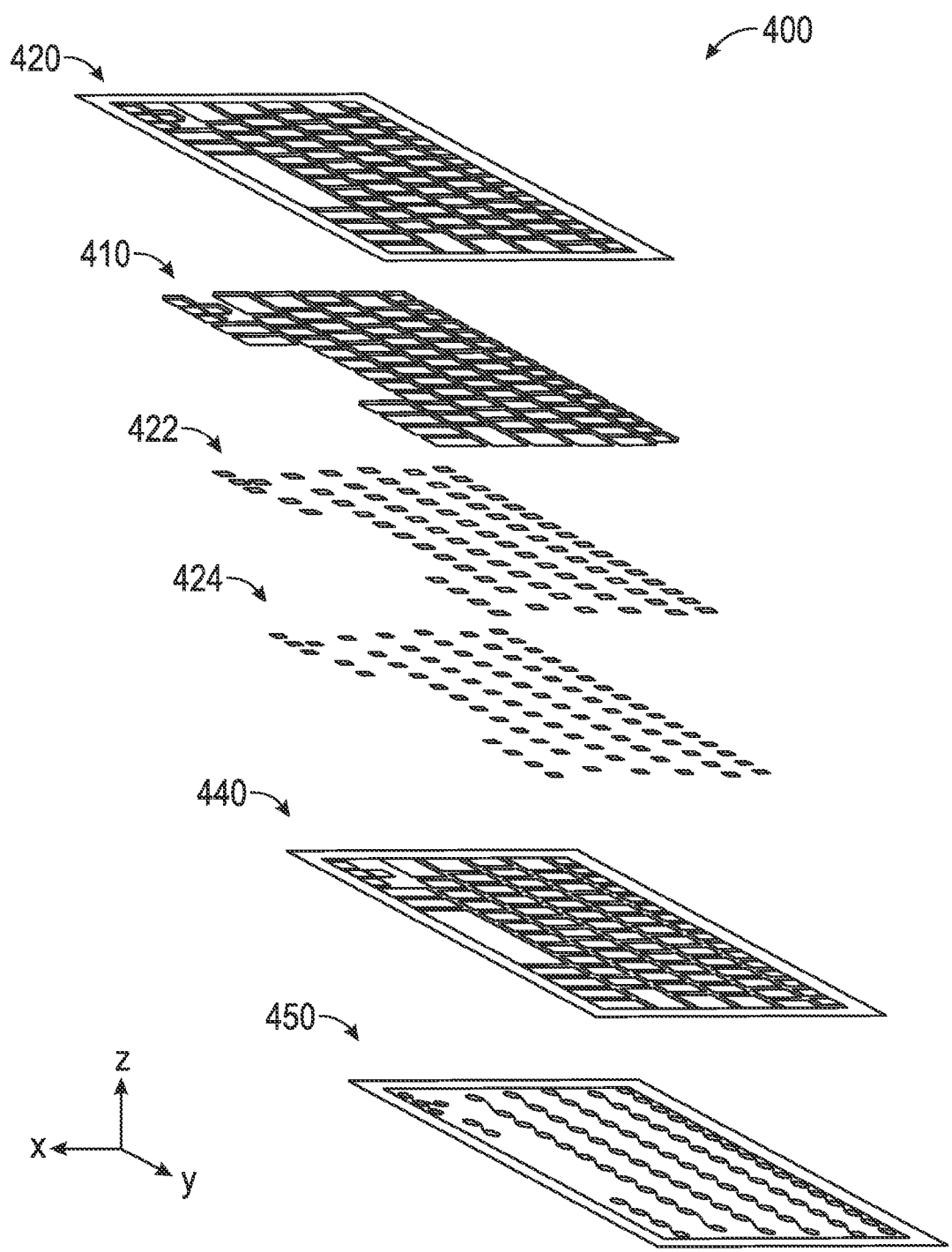
FIG. 4 shows an exploded view of an example keyboard in accordance with the techniques described herein

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5A:
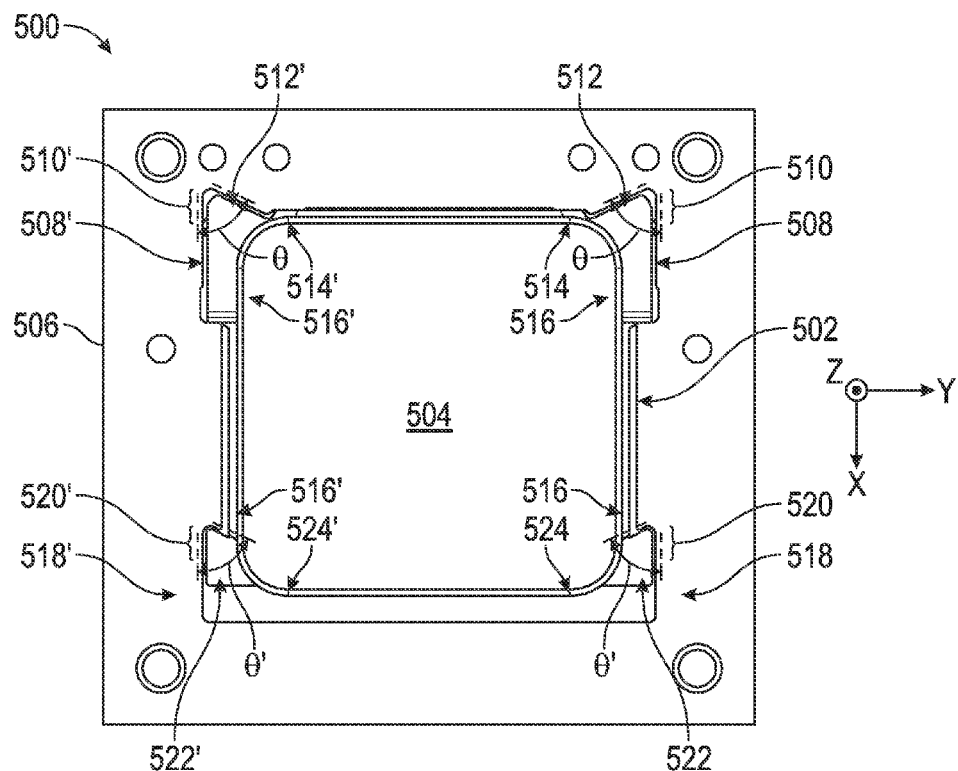
FIG. 5A is a top plan view of a touchsurface assembly according to an embodiment.

FIG. 5A shows a top plan view of a key assembly 500 that may be used to enable the key 122 of the keyboard 100. The key assembly 500 may also be used in other devices utilizing keys, including keyboards other than the keyboard 100 and any other appropriate key-using device. The key assembly 500 comprises a keycap 502 having a touch surface 504 that a user may press (i.e., impart a press force on the touch surface) to move the keycap from an unpressed position to a pressed position. As will be discussed in more detail below, fundamental embodiments of the key assembly 500 facilitate the keycap moving in a press direction (i.e., in the negative Z direction in the example of FIG. 5A) and a direction orthogonal to the press direction (e.g., in the positive X direction, which may be toward the user). This dual direction of movement gives the impression to the user that the keycap has traveled in the negative Z direction farther than it actually has. This allows a more compact (thinner) touchsurface assembly to impart to the user the feel of a conventional touchsurface assembly (e.g., a computer keyboard).

As illustrated in FIG. 5A, the keycap 502 has first and second key legs (508 and 508', respectively), extending outward from the keycap 502. As will discussed below, the key legs 508 and 508' have ramp contacting features (526' in FIG. 5B) that contact and move along ramps (528 and 528' in FIG. 5B) in the base 506 when moving from the unpressed position to the pressed position. Each key leg 508 and 508' has an angular protrusion 510 and 510' having a protrusion angle θ (512 and 512') relative to a first second side portion 514 and 514' (e.g., the backside portion in this example) and a second side portion 516 and 516' (e.g., a left or right side portion in this example) of the keycap 502. For keycaps that are not square or rectangular, the first and second side portions of the keycap may be angles, arcs or other shapes depending upon the geometry of the keycap.

As will be discussed in more detail below, the angular protrusions 510 and 510' of the keycap resist rotation of the keycap 502 about the Z axis as the keycap 502 moves from the unpressed position toward the pressed position by contacting angular features in the base 506. Accordingly, the angular protrusion 510 and 510' may take any form desired in any particularly embodiment to facilitate the anti-rotation feature. In some embodiments, the edges of the angular protrusion 510 and 510' may be substantially straight, while in other embodiments the angular protrusion 510 and 510' may have curved (e.g., convex or concave) edges or have a radii of curvature.

In some embodiments, the keycap 502 further comprises third and fourth key legs (518 and 518', respectively) extending outward from the keycap 502. Each key leg 518 and 518' also has angular protrusions 520 and 520' having a protrusion angle θ' (522 and 522') relative to a first side 524 and 524' portion and a second side portion 516 and 516' of the keycap 502. The key legs 518 and 518' have ramp contacting features (not shown in FIGS. 5A-B) that contact and move along ramps (530' in FIG. 5B) in the base 506 when moving from the unpressed position to the pressed position.

In some embodiments, the protrusion angels 512, 512', 522 and 522' are equal, while in other embodiments the protrusion angels 512 and 512' have one angle and 522 and 522' have a different angle. In some embodiments, the protrusion angels 512, 512', 522 and 522' are acute angles (θ and θ') in a range of 45-70 degrees. However, it will be appreciated that in some embodiments, the protrusion angles could be obtuse angles to facilitate the anti-rotation feature for the keycap 502.

Figure 5B:
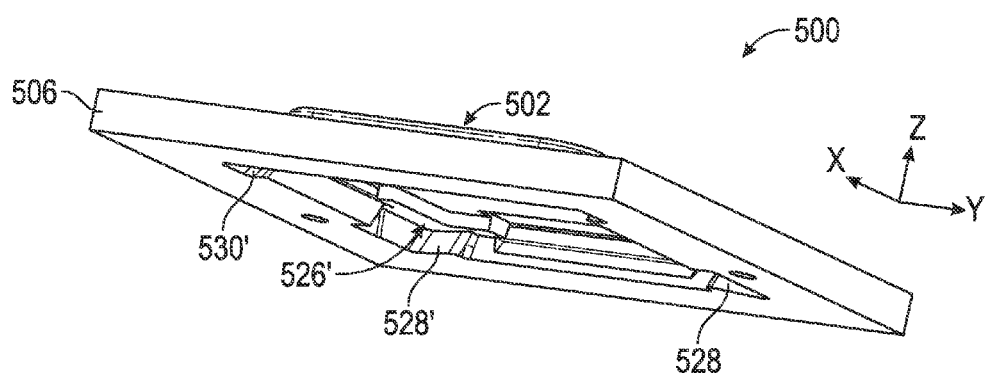
FIG. 5B is a perspective bottom view of the touchsurface assembly of according to an embodiment.

FIG. 5B is perspective bottom view of the key assembly 500. In this view, the first and second ramps 528 and 528' in the base 506 that guide the ramp contacting features (only 526' shown in FIG. 5B) of the keycap 502 can be seen. In those embodiments that have third and fourth key legs (518 and 518' in FIG. 5A), corresponding ramps (only 530' shown in FIG. 5B) are also provided to facilitate movement of the keycap from the unpressed to the pressed position responsive to the application of a press force.

Figure 6A:
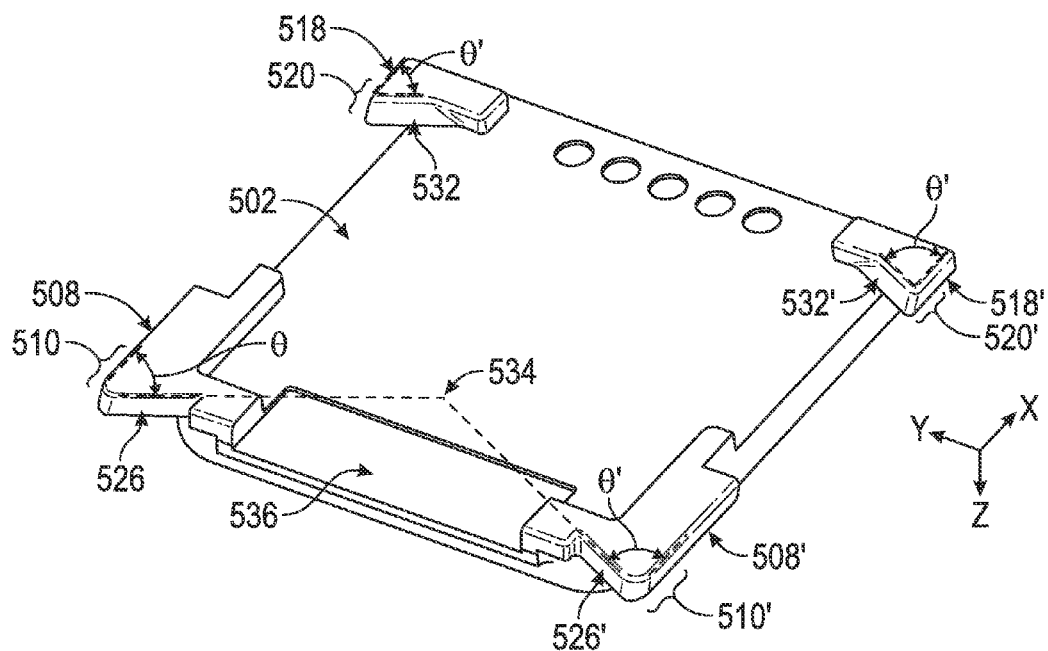
FIG. 6A is a perspective view of the keycap of FIGS. 5A-B.
Figure 6B:
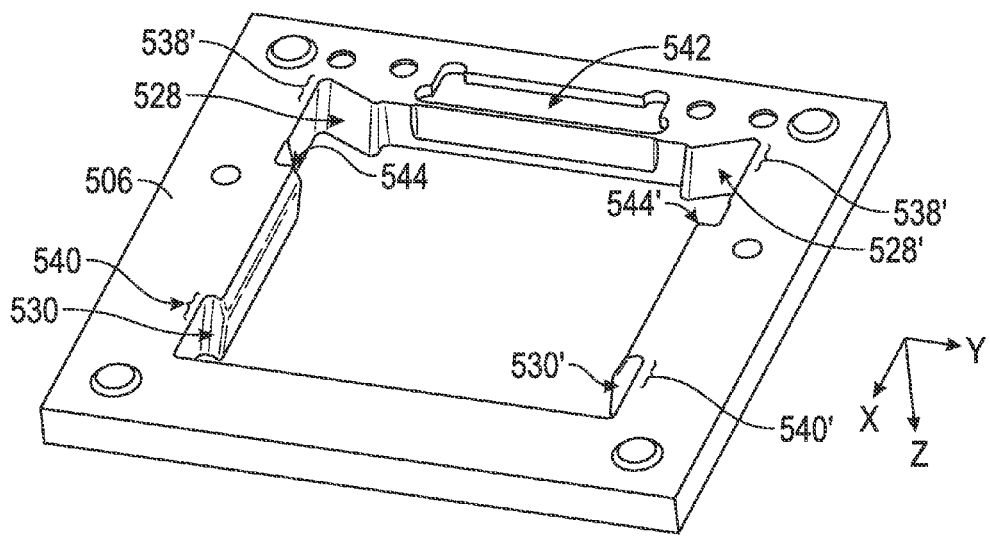
FIG. 6B is a perspective view of the bottom surface of the base of FIGS. 5A-B.

FIGS. 6A-B are perspective bottom views of the keycap 502 and the base 506 of FIG. 5A, respectively, that will facilitate appreciation of the features of the key assembly 500. In FIG. 6A, the first and second ramp contacting features 526 and 526' that contact and move along first and second ramps (528 and 528' in FIG. 6B) in the base 506 are illustrated. Each of the first and second ramp contacting features 526 and 526' has an angular protrusions 510 and 510' having protrusion angles θ as discussed above in connection with FIG. 5A. In those embodiments having third and fourth key legs (518 and 518', respectively), angular protrusions 520 and 520' having protrusion angles θ' and ramp contacting features 532 and 532' contact and move along ramps (530 and 530' in FIG. 6B) in the base 506 when moving from the unpressed position to the pressed position. As noted above, in some embodiments, the protrusion angels 512, 512', 522 and 522' (of FIG. 5A) are equal, while in other embodiments the protrusion angels 512 and 512' have one angle and 522 and 522' have a different angle. In some embodiments, the protrusion angels 512, 512', 522 and 522' are acute angles (θ and θ') in a range of 45-70 degrees. In some embodiments, the protrusion angles 526 and 526' of the angular protrusions 510 and 510' demark a chevron shape 534 oriented substantially toward the center portion of the keycap 502 (i.e., in the positive X direction as shown in FIG. 5A). It will be appreciated, however, that in other embodiments the protrusion angles 526 and 526' of the angular protrusions 510 and 510' demark a chevron shape oriented in other directions.

In some embodiments, a magnetic ready/return mechanism (320 in FIG. 3) is utilized to bias the keycap 502 toward a ready position (e.g., ready to receive a press force). In such embodiments, the keycap 502 may include a recess 536 to receive a first magnetic component of the magnetic ready/return mechanism. In some embodiments, the first magnetic component comprises a magnet, while in some embodiments, the first magnetic component comprises a non-magnetized ferrous material.

FIG. 6B illustrates a bottom perspective view of the base 506. In this view, the first and second ramps 528 and 528' and the third and fourth ramps 530 and 530' can be seen. The first and second ramps 528 and 528' guide the first and second ramp contacting features (526 and 526' in FIG. 6A) along the ramps toward the pressed position when the touchsurface 504 of the keycap 502 receives a press force. Similarly, the third and fourth ramp contacting features (532 and 532' in FIG. 6A) contact and move along the third and fourth ramps 530 and 530' in those embodiments employing the additional ramp guidance.

In some embodiments, the ramp angle of the first and second ramps 528 and 528' is between 45-70 degrees and in some embodiments comprises ramps having a ramp angle of 57 degrees. In some embodiments, the ramp angle of the third and fourth ramps 530 and 530' is the same as the first and second ramps 528 and 528', while in other embodiments the third and fourth ramps 539 and 530' have a different ramp angle than the first and second ramps 528 and 528'. In those embodiments where the third and fourth ramps 530 and 530' have a different ramp angle than the first and second ramps 528 and 528', the ramp angle of the third and fourth ramps 530 and 530' is shallower than the ramp angle than the first and second ramps 528 and 528' by approximately 3-10 degrees.

The base 506 also comprises angular features 538 and 538' that contact the angular protrusions 510 and 510' of the keycap 502 to resist rotation of the keycap 502 about the Z axis as the keycap 502 moves from the unpressed position toward the pressed position. In those embodiments have the third and fourth ramps 530 and 530', angular features 540 and 540' are also provided. In this way, when a keycap 502 is pressed near one of the corners, the keycap 502 will first settle into all of its ramp guiding surfaces. The ramps guiding surfaces comprise the ramps (528, 528', 530 and 530') and angular features (538, 538', 540 and 540') of the base 506, and ramp contacting features (526, 526', 532 and 532') and angular protrusions on the keycap (510, 510', 520 and 520'). Collectively, these features help resist rotation of the keycap about the Z axes and resist "wobble" in the X or Y axes as the keycap 502 moves from the unpressed position toward the pressed position.

In some embodiments, a magnetic ready/return mechanism (320 in FIG. 3) is utilized to bias the keycap 502 toward a ready position (e.g., ready to receive a press force). In such embodiments, the base 506 may include a recess 542 to receive a second magnetic component of the magnetic ready/return mechanism. In some embodiments, the second magnetic component comprises a magnet, while in embodiments where the first magnetic component is a magnet, the second magnetic component comprises a non-magnetized ferrous material.

Also visible in FIG. 6B is the locations in the base 506 for reverse ramps 544 and 544'. As will be discussed in more detail below, the reverse ramps 544 and 544' contact reverse ramp contacting features of the keycap 502 as the keycap moves from the unpressed position toward the pressed position and provide further advantages as will be appreciated.

FIGS. 7A-B illustrate simple cross-section side views of the key assembly 500 where like reference numeral designations denote like elements in FIGS. 5-6. In FIG. 7A, the keycap 502 is shown in the unpressed (i.e., ready) position, while in FIG. 7B, the keycap 502 is shown in the pressed position responsive to the touchsurface 504 receiving a press force 546.

As noted above, in some embodiments, the ramp angle 548 (φ) of the first ramp 528 is between 45-70 degrees and in some embodiments comprise ramps having a ramp angle 548 of 57 degrees. In those embodiments implementing the third and fourth ramps (only the third ramp 530 is shown in FIGS. 7A-B), the ramp angle 550 (φ') of the ramp 530 may be the same as the first ramp angle 548, while in other embodiments the third ramp angle 550 is a different angle than the first ramp 528. In those embodiments where the third ramp 530 has a different ramp angle than the first ramp 528, the ramp angle 550 of the third ramp 530 is shallower than the ramp angle 548 of the first ramp 528 and by approximately 3-10 degrees. As a non-limiting example, if the ramp angle 548 of the first ramp 528 is 57 degrees, then the ramp angle 550 of the third ramp 530 may be 52 degrees.

Those embodiments having a shallower third ramp angle 550 as compared to the first ramp angle 548 offer an advantage in the event a user presses the keycap 502 off-center. As a non-limiting example, if the keycap 502 were to be pressed near a front edge of the keycap (the left side of the keycap illustrated in FIG. 7A), the ramp contacting feature 526 may move away from the first ramp 528 and thus "float" on the backside of the keycap because the magnetic ready/return mechanism tends to pull (magnetically attract) the rear of the keycap upward. This can cause the keycap 502 to tilt and/or about the Y axis while moving toward the pressed position which may result in an undesirable user experience. Additionally, "floating" effect of the keycap may result in inconsistent positing of the magnetic component of the keycap resulting in erroneous sensing that the keycap has been pressed by the user toward the pressed position. By having the third ramp angle 550 shallower than the first ramp angle 548, any tilting of the keycap 502 can be reduced. This reduction results from the shallower slope of the third ramp 530 driving the front of the keycap 502 laterally (i.e., in the positive X direction) at a higher rate and the steeper slope of the first ramp 528 driving the back of the keycap laterally at a lower rate. The unequal amounts of driven motion compensates for a gap 554 that separates the key leg 508 and the reverse ramp 544. Typically, the gap 554 is used to ease manufacturing tolerance requirements to facilitate manufacturability of the key assembly 500. Since, the additional X-direction motion of the third key leg 518 will cause the first key leg 508 to contact the reverse ramp 544, the first key leg 508 is provided with a reverse ramp contacting feature 552, that guides the first key leg 508 toward the press position (as shown in FIG. 7B) in the event that the ramp contacting feature 526 is pulled of the first ramp 528 by the off-center key press by the user. Additionally, upon removal of the press force 546, the reverse ramp 544 guides the keycap 502 in the negative X direction so that the ramp contacting feature 526 can contact the first ramp 528 as the keycap 502 moves toward the unpressed position.

In some embodiments, the key assembly 500 includes a sensor 560 for detecting the pressed state of the keycap 502 or the movement of the keycap 502 away from the unpressed state. The sensor 560 may use any appropriate technology, including any of the ones described herein. In some embodiments, the sensor 560 detects changes in capacitance, the keycap 502 comprises primarily dielectric material, and the change in the position of the dielectric material of the keycap 502 causes the primary changes in capacitance detected by the sensor 560. In some embodiments, the sensor 560 detect changes in capacitance, conductive material is disposed in or on the keycap 502, and the change in position of the conductive material of the keycap 502 causes the primary changes in capacitance detected by the sensor 560. In some embodiments, the sensor 560 is configured to actively detect unpressed and pressed positions of the keycap 502. In some embodiments, the sensor 560 is configured to actively detect only the pressed state of the keycap 502, and it is assumed that no detection of the pressed state means the keycap 502 is unpressed, or vice versa. A processing system (not shown) communicatively coupled to the sensor 560 operates the sensor 560 to produce signals indicative of the pressed state of the key assembly, and determines a press state of the keycap 502 based on these signals.

Figure 8:
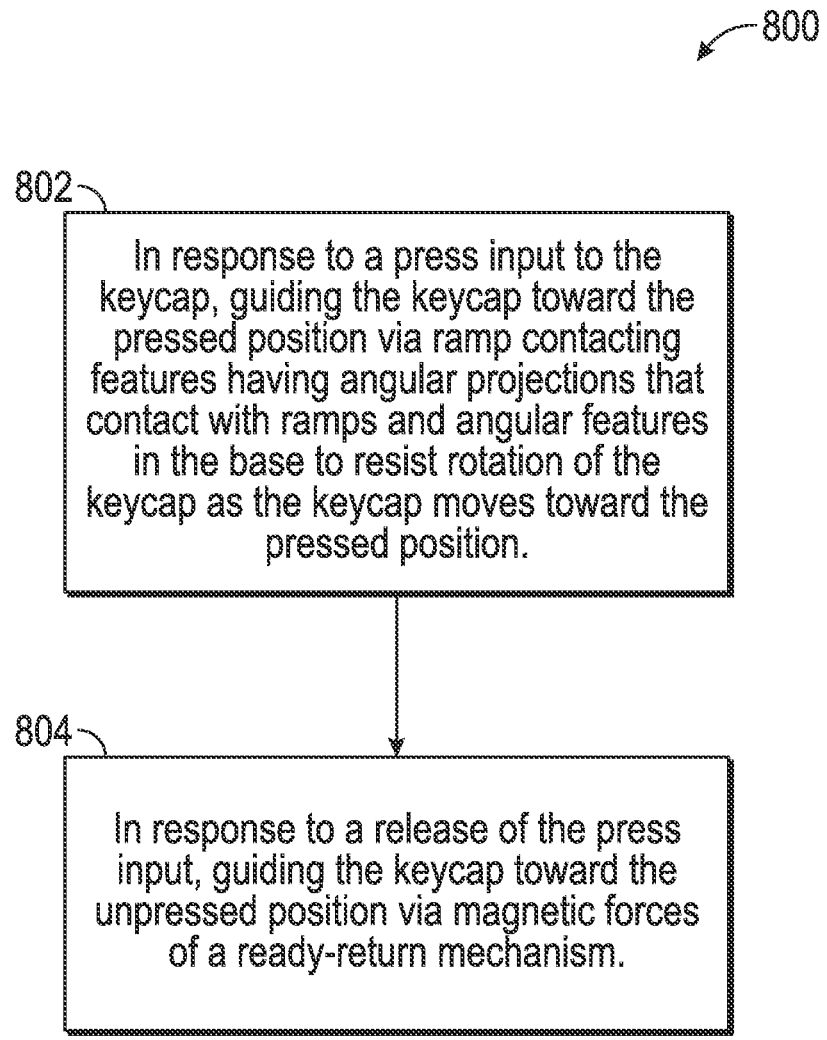
FIG. 8 is flow chart illustrating a method of effecting motion of a keycap of a key assembly according to an embodiment.

FIG. 8 shows an example method 800 that can be used for effecting motion of a pressable touchsurface of a touchsurface assembly, such as, in some embodiments, the keycap of a key assembly. The keycap is configured to move between an unpressed position and a pressed position relative to a base of the key assembly, where the unpressed and pressed positions are separated in a press direction and in a lateral direction orthogonal to the press direction.

In step 802, in response to a press input to the keycap, guiding the keycap toward the pressed position via ramp contacting features having angular projections that contact with ramps and angular features in the base to resist rotation of the keycap as the keycap moves toward the pressed position.

In step 804, in response to a release of the press input, guiding the keycap toward the unpressed position via magnetic forces of a ready-return mechanism.

Thus, the techniques described herein can be used to implement any number of devices utilizing different touchsurface assemblies, including a variety of keyboards each comprising one or more key assemblies in accordance with the techniques described herein. For example, some embodiments of keyboards, the keys of the keyboard may have angular protrusions of different shapes or different protrusion angles. In some embodiments, the ramp angles may vary between keys to provide a different user experience as the key moves between an unpressed position and a pressed position.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions.

What is claimed is:

1. A key assembly, comprising:
   a keycap having a touch surface for receiving a press force that moves the keycap from an unpressed position toward a pressed position, the unpressed position and pressed position separated in a press direction and a second direction orthogonal to the press direction, the keycap having first and second ramp contacting features comprising first and second angular protrusions having first and second protrusion angles relative to first and second side portions of the keycap, respectively,
   wherein the first angular protrusion and the second angular protrusion extend in a plane parallel to a plane of the touch surface, and
   wherein the first protrusion angle of the first angular protrusion and the second protrusion angle of the second angular protrusion are each angled in a direction incident with the first side portion of the keycap; and
   a base having first and second ramps that contact the first and second ramp contacting features and guide the keycap in the press direction and the second direction as the keycap moves from the unpressed position toward the pressed position, the base also having first and second angular features configured to contact the first and second angular protrusions of the first and second ramp contacting features, respectively;
   wherein the first and second angular protrusions contact the first and second angular features to resist rotation of the keycap as the keycap moves toward the pressed position.

2. The key assembly of claim 1, wherein:
   the keycap includes a first magnetic component; and
   wherein the base includes a second magnetic component; and
   wherein the first and second magnetic components form a ready-return mechanism that biases the keycap toward the unpressed position.

3. The key assembly of claim 2, wherein at least one of the first and second magnetic components comprises a non-magnetized ferrous material.

4. The key assembly of claim 1, wherein the ramps in the base include reverse ramps and the ramp contacting features include reverse ramp contacting surfaces.

5. The key assembly of claim 1, wherein:
   the keycap further comprises third and fourth ramp contacting features extending from the keycap and disposed farther from a ready-return mechanism than the first and second ramp contacting features, the third and fourth ramp contacting features comprising third and fourth angular protrusions having third and fourth protrusion angles relative to first and second side portions of the keycap, respectively; and
   wherein the base further comprises third and fourth ramps that contact the third and fourth ramp contacting features and guide the keycap in the press direction and the second direction as the keycap moves from the unpressed position toward the pressed position, the base also having third and fourth angular features configured to receive the third and fourth angular protrusions of the third and fourth ramp contacting features, respectively; and
   wherein the third and fourth angular protrusions contact with the third and fourth angular features resist rotation of the keycap as the keycap moves toward the pressed position.

6. The key assembly of claim 5, wherein a slope of the first ramp and a slope of the third ramp are different.

7. The key assembly of claim 6, wherein the slope of the third ramp is shallower than the slope of the first ramp.

8. The key assembly of claim 6, wherein the slope of the third ramp is shallower than the slope of the first ramp by 3-10 degrees.

9. The key assembly of claim 1, wherein the first and second protrusion angles of the first and second angular protrusions are acute angles.

10. The key assembly of claim 9, wherein the first and second protrusion angles of the first and second ramp angular protrusions are each in a range of 45-70 degrees.

11. The key assembly of claim 1, wherein the first and second angular protrusions demark a chevron shape oriented substantially toward a center portion of the keycap.

12. The key assembly of claim 1, further comprising a capacitive sensor for sensing when the keycap is in the pressed position.

13. A keyboard, comprising:
   a plurality of keycaps, each keycap of the plurality of keycaps having a touch surface for receiving a press force that moves the keycap from a unpressed position toward a pressed position, the unpressed position and pressed position separated in a press direction and a second direction orthogonal to the press direction;
   each keycap of the plurality of keycaps also having ramp contacting features comprising first and second angular protrusions having first and second protrusion angles relative to first and second side portions of the keycap, respectively,
   wherein the first angular protrusion and the second angular protrusion extend in a plane parallel to a plane of the touch surface, and
   wherein the first protrusion angle of the angular protrusion and the second protrusion angle of the second angular protrusion are each angled in a direction incident with the first side portion of the keycap; and
   a base having, for each corresponding keycap of the plurality of keycaps, first and second ramps that contact the ramp contacting features of the corresponding keycap, and guide the corresponding keycap in the press direction and the second direction as the corresponding keycap moves from the impressed position toward the pressed position, the base also having, for each corresponding keycap of the plurality of keycaps, first and second angular features configured to contact the first and second angular protrusions of the ramp contacting features of the corresponding keycap, respectively, to resist rotation of the corresponding keycap as the corresponding keycap moves toward the pressed position.

14. The keyboard of claim 13, wherein, for each keycap of the plurality of the keycaps:
the keycap includes a first magnetic component;
the base includes a second magnetic component; and
the first and second magnetic components form a ready-return mechanism that biases the keycap towards the unpressed position.

15. The keyboard of claim 14, wherein, for each keycap of the plurality of keycaps:
the keycap includes third and fourth ramp contacting features extending from the keycap and disposed farther from the ready-return mechanism than the first and second ramp contacting features of the keycap, the third and fourth ramp contacting features comprising third and fourth angular protrusions having third and fourth protrusion angles relative to first and second side portions of the keycap, respectively; and
wherein the base includes third and fourth ramps that contact the third and fourth ramp contacting features and guide the keycap in the press direction and the second direction as the keycap moves from the unpressed position toward the pressed position, the base including third and fourth angular features configured to contact the third and fourth angular protrusions, respectively, to resist rotation of the keycap as the press force moves the keycap toward the pressed position.

16. The keyboard of claim 15, wherein for a keycap of the plurality of keycaps, a slope of the third ramp is shallower than a slope of the first ramp.

17. The keyboard of claim 15, wherein the first and second protrusion angles of a keycap of the plurality of keycaps are each in a range of 45-70 degrees.

18. The keyboard of claim 13, further comprising capacitive sensor electrodes for sensing when keycaps of the plurality of keycaps are in the pressed position.

19. A method of effecting motion of a keycap of a key assembly, wherein the keycap is configured to move between an unpressed position and a pressed position relative to a base, wherein the unpressed and pressed positions are separated in a press direction and in a lateral direction orthogonal to the press direction, the method comprising:
in response to a press input to the keycap, guiding the keycap toward the pressed position via ramp contacting features having angular projections that contact with ramps and angular features in the base to resist rotation of the keycap as the keycap moves toward the pressed position,
wherein the angular projections extend in a plane parallel to a plane of a touch surface of the keycap, and
wherein projection angle of the angular projections is angled in a direction incident with a side portion of the keycap.

20. The method of claim 19, further comprising: in response to a release of the press input, guiding the keycap toward the unpressed position via magnetic forces of a ready-return mechanism.

* * * * *